(12) United States Patent
Benaissa

(10) Patent No.: US 8,294,243 B2
(45) Date of Patent: Oct. 23, 2012

(54) LATERAL BIPOLAR TRANSISTOR WITH COMPENSATED WELL REGIONS

(75) Inventor: Kamel Benaissa, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 12/941,415

(22) Filed: Nov. 8, 2010

(65) Prior Publication Data

US 2011/0049678 A1 Mar. 3, 2011

Related U.S. Application Data

(62) Division of application No. 11/965,935, filed on Dec. 28, 2007, now Pat. No. 7,829,405.

(51) Int. Cl.
*H01L 27/02* (2006.01)

(52) U.S. Cl. .......... 257/575; 257/E29.174; 257/E29.182

(58) Field of Classification Search ................. 257/575, 257/E29.174, E29.182
See application file for complete search history.

(56) References Cited

U.S. PATENT DOCUMENTS

| 6,093,613 A | 7/2000 | Verma et al. |
| 6,127,236 A | 10/2000 | Prall et al. |
| 2007/0241426 A1* | 10/2007 | Hiroshima et al. ........... 257/565 |

* cited by examiner

*Primary Examiner* — Daniel Whalen
(74) *Attorney, Agent, or Firm* — Alan A. R. Cooper; Warren L. Franz; Frederick J. Telecky, Jr.

(57) ABSTRACT

Conduction between source and drain or emitter and collector regions is an important characteristic in transistor operation, particularly for lateral bipolar transistors. Accordingly, techniques that can facilitate control over this characteristic can mitigate yield loss by promoting the production of transistors that have an increased likelihood of exhibiting desired operational performance. As disclosed herein, well regions are established in a semiconductor substrate to facilitate, among other things, control over the conduction between the source and drain regions of a lateral bipolar transistor, thus mitigating yield loss and other associated fabrication deficiencies. Importantly, an additional mask is not required in establishing the well regions, thus further mitigating (increased) costs associated with promoting desired device performance.

13 Claims, 7 Drawing Sheets

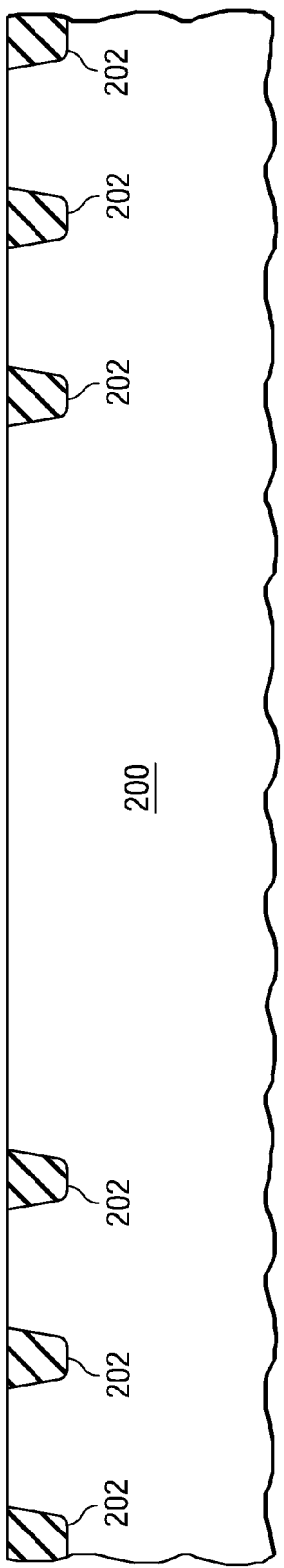
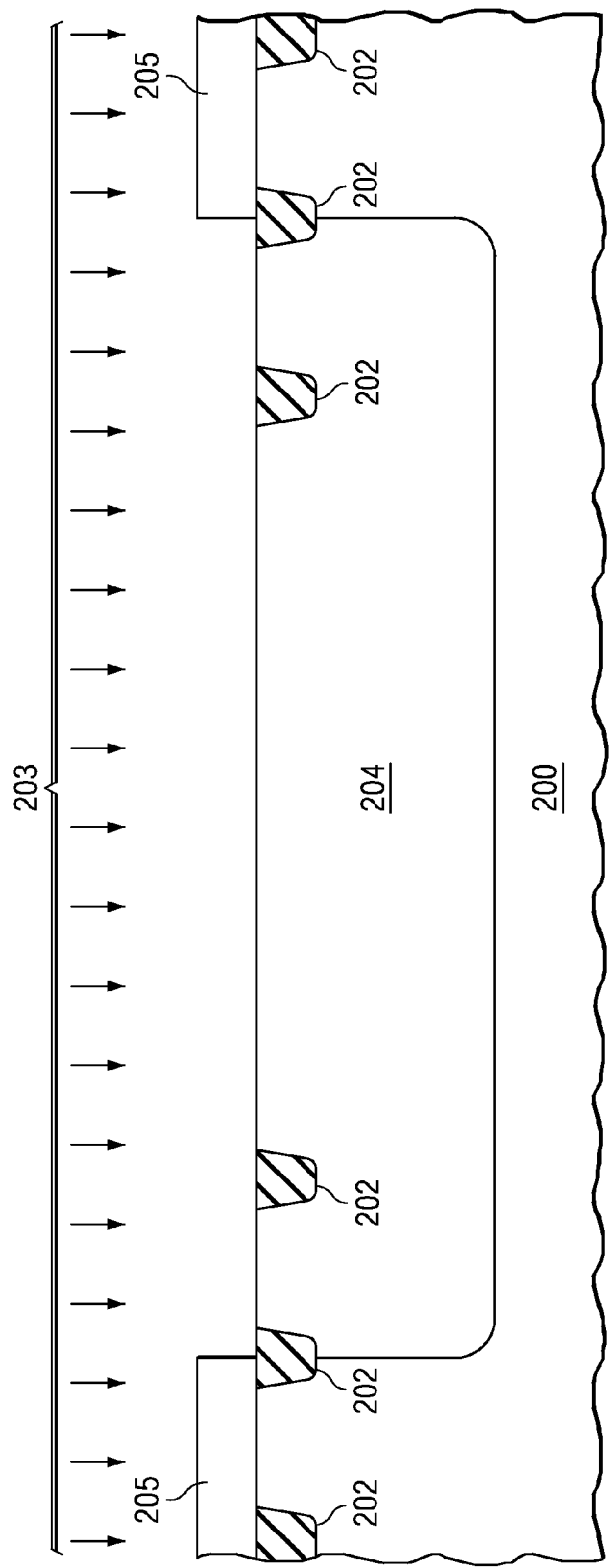

LATERAL BIPOLAR TRANSISTOR WITH COMPENSATED WELL REGIONS

This application is a division of prior application Ser. No. 11/965,935, filed Dec. 28, 2007 the entirety of which is hereby incorporated by reference.

BACKGROUND

The disclosure herein relates generally to semiconductor processing, and more particularly to fashioning a lateral bipolar transistor having one or more compensated well regions.

Several trends presently exist in the semiconductor and electronics industry. Devices are continually being made smaller, faster and requiring less power. One reason for these trends is that more personal devices are being fabricated that are relatively small and portable, thereby relying on a battery as their primary supply. For example, cellular phones, personal computing devices, and personal sound systems are devices that are in great demand in the consumer market. In addition to being smaller and more portable, personal devices are also requiring increased memory and more computational power and speed. In light of these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve high densities, there have been and continue to be efforts toward scaling down dimensions (e.g., at submicron levels) on semiconductor wafers, that are generally produced from bulk silicon. In order to accomplish such high densities, smaller feature sizes, smaller separations between features, and more precise feature shapes are required in integrated circuits (ICs) fabricated on small rectangular portions of the wafer, commonly known as dies. This may include the width and spacing of interconnecting lines, spacing and diameter of contact holes, as well as the surface geometry of various other features (e.g., corners and edges).

It can be appreciated that significant resources go into scaling down device dimensions and increasing packing densities. For example, significant man hours may be required to design such scaled down devices, equipment necessary to produce such devices may be expensive and/or processes related to producing such devices may have to be very tightly controlled and/or be operated under very specific conditions, etc. Accordingly, it can be appreciated that there can be significant costs associated with exercising quality control over semiconductor fabrication, including, among other things, costs associated with discarding defective units, and thus wasting raw materials and/or man hours, as well as other resources, for example. Additionally, since the units are more tightly packed on the wafer, more units are lost when some or all of a wafer is defective and thus has to be discarded. Accordingly, techniques that mitigate yield loss (e.g., a reduction in the number of acceptable or usable units), among other things, would be desirable.

SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

Conduction between source and drain or emitter and collector regions is an important characteristic in transistor operation, particularly for lateral bipolar transistors. Accordingly, techniques that can facilitate control over this characteristic can mitigate yield loss by promoting the production of transistors that have an increased likelihood of exhibiting desired operational performance. As disclosed herein, well regions are established in a semiconductor substrate to facilitate, among other things, control over the conduction between the source and drain regions of a lateral bipolar transistor, thus mitigating yield loss and other associated fabrication deficiencies. Importantly, an additional mask is not required in establishing the well regions, thus further mitigating (increased) costs associated with promoting desired device performance.

To the accomplishment of the foregoing and related ends, the following description and annexed drawings set forth certain illustrative aspects. Other aspects, advantages and/or features may, however, become apparent from the following detailed description when considered in conjunction with the annexed drawings.

BRIEF DESCRIPTION OF THE DRAWINGS

FIGS. 2-10 are cross-sectional views of an example semiconductor substrate whereon a transistor is fabricated as described herein.

DETAILED DESCRIPTION

Figure 1:
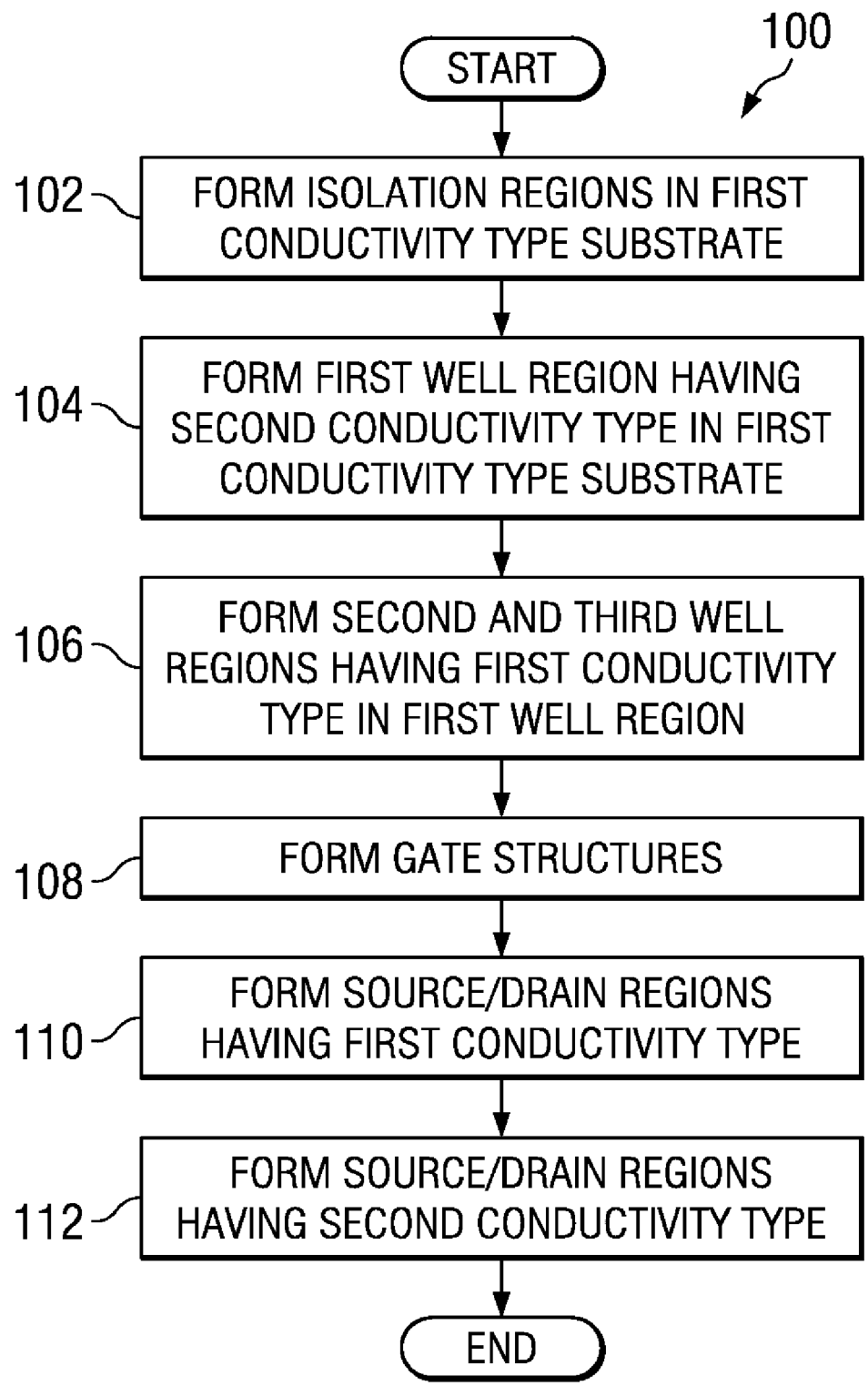
FIG. 1 is a flow diagram illustrating an example methodology for fashioning a transistor as described herein.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

An example methodology 100 for fashioning a transistor having source/drain well regions is illustrated in FIG. 1, and an example semiconductor substrate 200 whereon such a methodology is implemented is illustrated in cross-sectional view in FIGS. 2-10. As will be appreciated, forming source/drain well regions as disclosed herein mitigates yield loss by promoting the production of transistors that have more desirable current flow between source and drain regions. While the method 100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 102, isolation regions 202 are formed in the semiconductor substrate 200, where the substrate may have a first conductivity type (FIG. 2). For example, the substrate 200 may comprise a slight doping of p type dopant atoms (e.g., Boron (B)) and/or n type dopant atoms (e.g., Phosphorous (P), Arsenic (As) and/or Antimony (Sb)). The isolation regions 202 may be formed according to any suitable isolation techniques (e.g., shallow trench isolation (STI) and/or field oxide (FOX)) and may correspondingly comprise any suitable dielectric materials (e.g., oxide and/or nitride base materials). The isolation regions 202 serve to electrically isolate or insulate semiconductor devices (or regions thereof) formed in/on the substrate from one another. By way of example, STI regions are established by forming apertures in select locations of the surface of the substrate and then filling the apertures with a dielectric material, typically followed by a chemical mechanical polishing (CMP) process to make the surface of the isolation regions uniform with the surface of the substrate. With FOX, apertures are similarly initially formed at select locations around the surface of the substrate, but then an oxide based material is grown in these apertures to establish the electrically insulating material.

It will be appreciated that lithography is generally used to form apertures, vias and/or any other types of openings (e.g., patterning) in different layers in semiconductor processing. Lithography refers to processes for transferring one or more patterns between various media. In lithography, a light sensitive resist coating is formed over one or more layers to which a pattern is to be transferred. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched). Masks used in semiconductor processing (e.g., for lithography) are very expensive components of the process. Accordingly, it is advantageous to be able to utilize a mask more than once to form multiple (different) patterns/features in the same process.

At 104, a first well region 204 having a second conductivity type is formed in the substrate 200 (FIG. 3). The first well region may be formed by an implantation process 203 where patterned (lithographic) resist material 205 blocks dopant atoms from being implanted at other than desired areas. By way of example, if the conductivity type of the substrate 200 is p type (e.g., Boron (B)), then the conductivity type of the first well region 204 would be n type (e.g., Phosphorous (P), Arsenic (As) and/or Antimony (Sb)) (and vice versa). It will be appreciated, however, that unlike the resist material 205, the implanted dopant atoms can pass substantially unaffected through the isolation regions 202. The first well region 204 is dimensioned such that one or more isolation regions 202 are situated therein while other isolation regions overlie the interface or sidewalls between the first well region 204 and the substrate 200.

Figure 4:
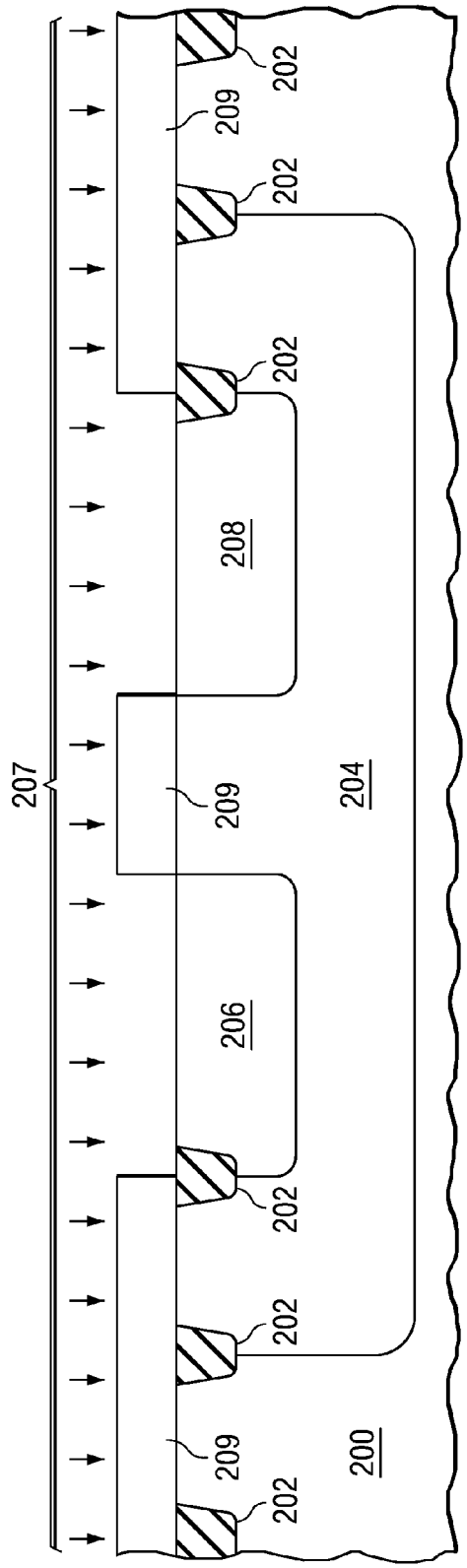

At 106, second 206 and third 208 well regions having the first conductivity type are formed in the first well region 204 in the substrate 200 (FIG. 4). As with the first well region 204, the second 206 and third 208 well regions can be formed by an implantation process 207 where patterned (lithographic) resist material 209 blocks dopant atoms from being implanted at other than desired areas in the substrate 200. Importantly, the second 206 and third 208 well regions are formed with a mask that is used as part of a standard CMOS fabrication process. In this manner, a new mask need not be produced and implemented to form these regions (and thus associated substantial costs are mitigated). Rather, an existing mask, or the use thereof, can merely be adjusted to facilitate the formation of the second 206 and third 208 well regions. For example, an existing mask may merely be shifted to allow radiation to (selectively) pass therethrough so that the pattern illustrated in FIG. 4 is indelibly formed therein, thus allowing for the formation of the second 206 and third 208 well regions (e.g., via implantation 207).

Figure 5:
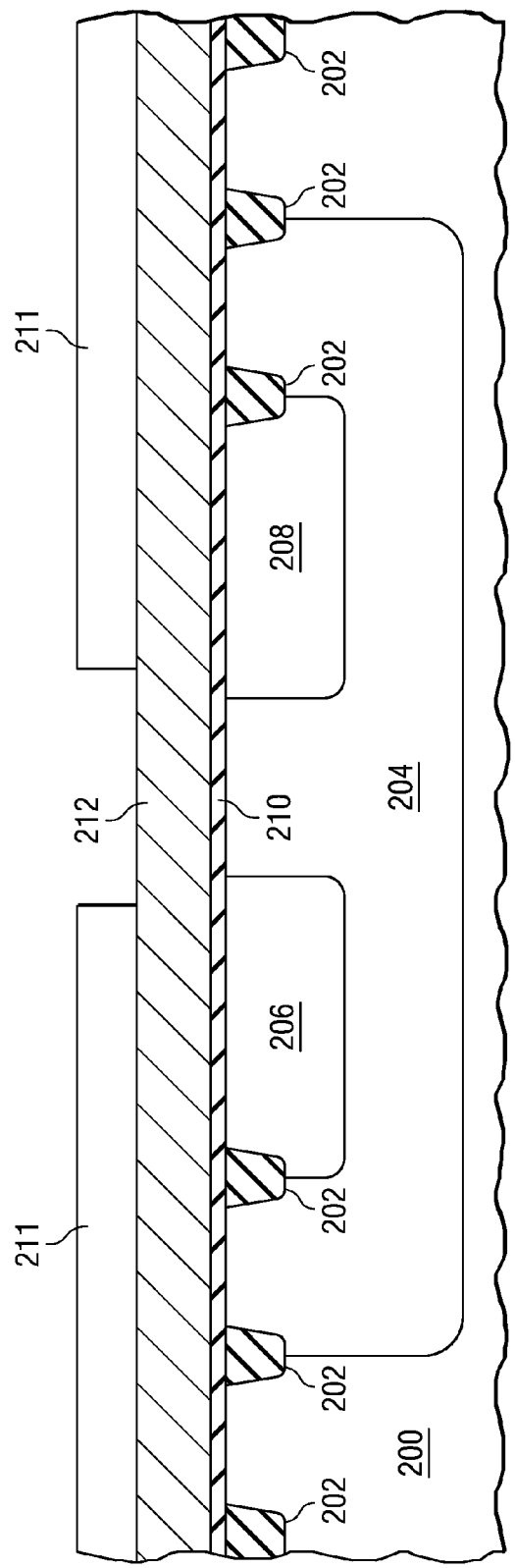
Figure 6:
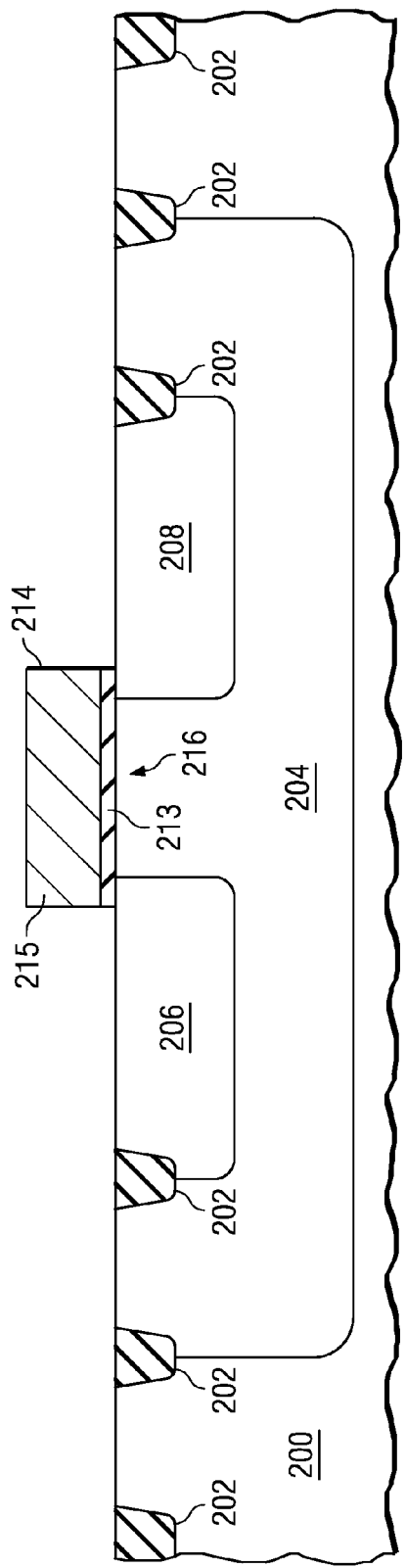

With the well regions formed, a gate structure or stack is formed at 108 over a channel region defined in the substrate 200 between the second 206 and third 208 well regions. To form the gate structure, a layer of gate dielectric material 210 is formed (e.g., grown) over the substrate 200 and a layer of gate electrode material 212 is formed (e.g., deposited) over the layer of gate dielectric material (FIG. 5). The layer of gate dielectric material 210 generally comprises an oxide (or other dielectric) based material and/or a high-k material, for example, and is relatively thin, being formed to a thickness of between about 1 nm and about 20 nm, for example. The layer of gate electrode material 212 generally comprises a polysilicon (or other semiconductor) based material, and is formed to a thickness of between about 20 nm and about 100 nm, for example. The layer of gate electrode material 212 and the layer of gate dielectric material 210 are then patterned (using a patterned (lithographic) resist 211 and an anisotropic etch, for example) to establish a gate structure or stack 214 comprising a gate dielectric 213 and a gate electrode 215 situated over the channel region 216 (FIG. 6).

Figure 7:
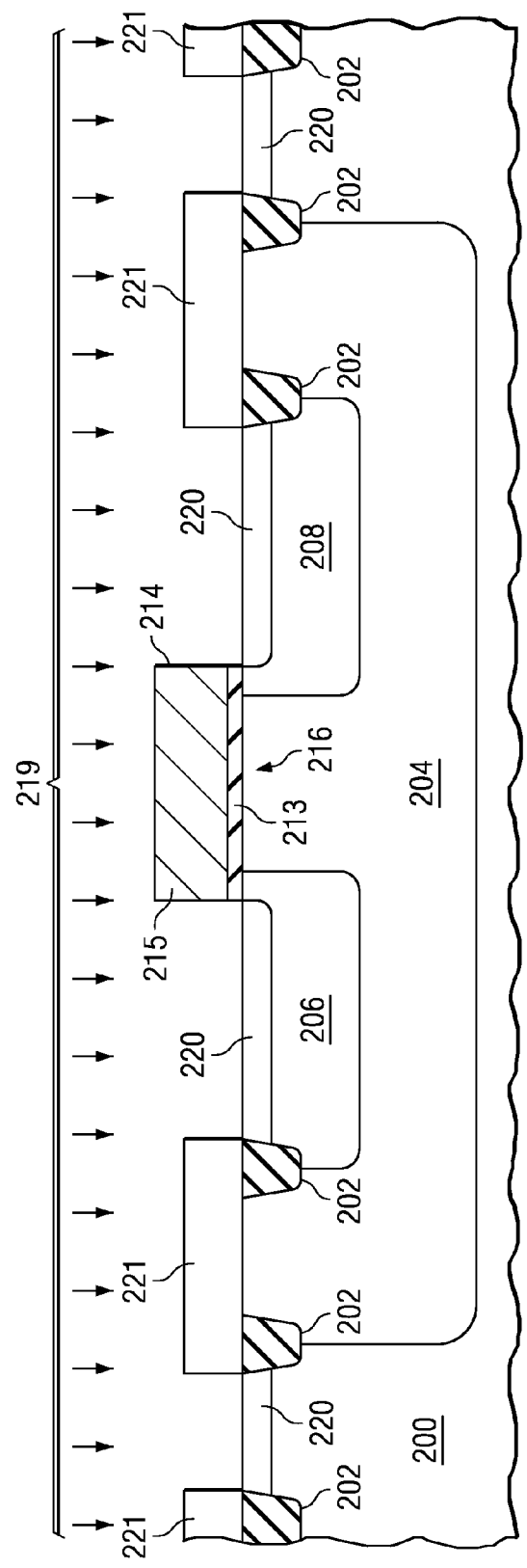

Source/drain regions 220 having the first conductivity type are formed in the second 206 and third 208 well regions at 110 (FIG. 7). In the illustrated example, these regions 220 are also formed outside of the first well region 204. These regions 220 may be formed by an implantation process 219 where patterned (lithographic) resist material 221 and the gate structure 214 blocks dopant atoms from being implanted at other than desired areas. It can be appreciated that some of the dopants may also be implanted into the top of the gate electrode 215, which may be desirable depending on the type of transistor being formed. Additionally, although not illustrated, it will be appreciated that prior to forming the source/drain regions 220, offset spacers may be formed on the sides of the gate structure 214 followed by extension implants into the substrate that are blocked by the offset spacers (and other materials, such as patterned resist, for example). Similarly, sidewall spacers (also not illustrated) may be formed over the offset spacers so that the source/drain 220 regions extend into the channel region 216 even less than the extension regions. Such offset and sidewall spacers generally comprise dielectric based materials, such as oxide and/or nitride based materials, for example.

Figure 8:
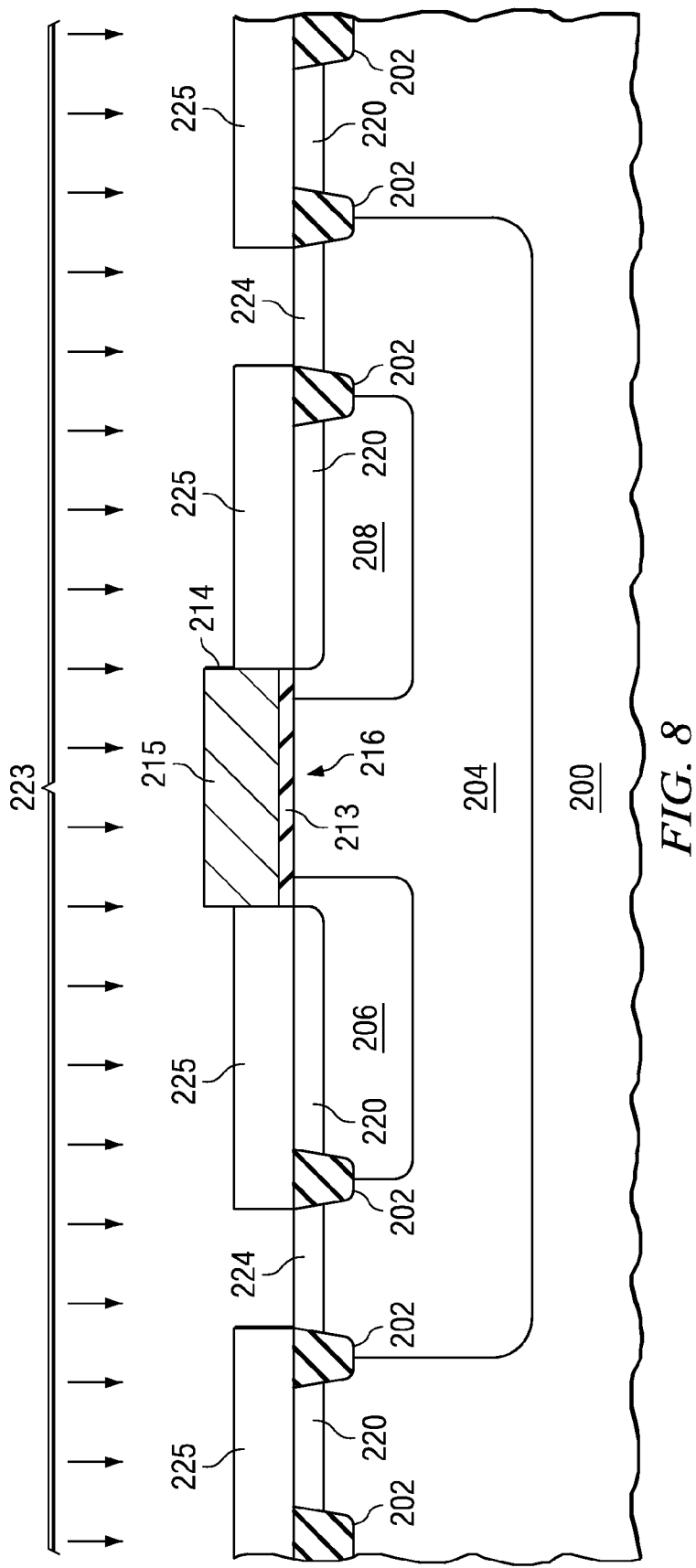
Figure 9:
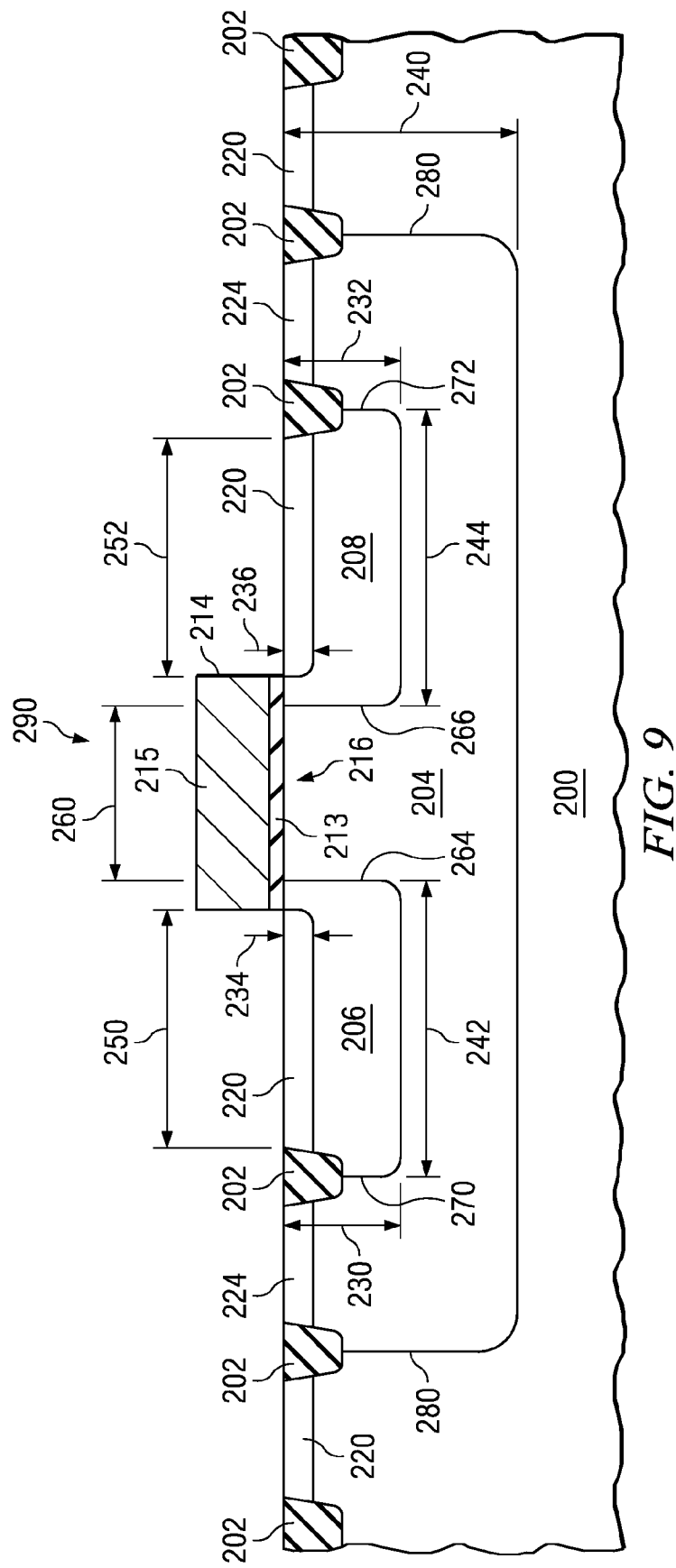

At 112, source/drain regions 224 having the second conductivity type are formed in the first well region 204, but not in the second 206 and third 208 well regions (FIG. 8). These regions 224 may be formed by an implantation process 223 where patterned (lithographic) resist material 225 (and possibly the gate structure 214 if it is not covered by resist material 225 (as illustrated)) blocks dopant atoms from being implanted at other than desired areas. The patterned resist is stripped thereafter leaving the finished device 290 (FIG. 9). The method 100 then ends where further back end processing can be performed, such as where one or more conductive and/or dielectric layers can be formed and treated in some manner, for example. One or more annealing operations can likewise be performed to activate dopants of source/drain regions, for example (e.g., to drive them into channel regions). The transistor "operates", at least in part, by conducting a current in the channel region 216 between the source/drain regions 220 when certain (respective) voltages are applied to the gate electrode 215 and the source/drain regions 220.

In the illustrated example, the second 206 and third 208 well regions are formed to respective depths 230, 232 that are substantially greater than the respective depths 234, 236 of the source/drain 220 regions (FIG. 9). In one example, the respective depths 234, 236 of the source/drain regions 220 are between about ¼ and about 1/50$^{th}$ of the respective depths 230, 232 of the second 206 and third 208 well regions. Similarly, the respective depths 230, 232 of the second 206 and third 208 well regions are between about ⅔ and about 1/20 the depth 240 of the first well region 204. Also, the respective depths 230, 232 of the second 206 and third 208 well regions are less than the respective widths 242, 244 of the second 206 and third 208 well regions, and the respective widths 250, 252 of the source/drain regions 220 are likewise less than the respective widths 242, 244 of the second 206 and third 208 well regions. The channel region 216 has a length 260 that is less than the respective widths 242, 244 of the second 206 and third 208 well regions.

In one example, the second well region 206 is formed to a depth 230 of between about 400 nm and about 700 nm; the third well region 208 is formed to a depth 232 of between about 400 nm and about 700 nm; the source/drain regions 220 are formed to depths 234, 236 of between about 100 nm and about 200 nm; the first well region 204 is formed to a depth 240 of between about 500 nm and about 1000 nm; the second 206 and third 208 well regions are formed by implanting a dopant of Boron at a concentration of about $1 \times 10^{13}/cm^3$; the source/drain regions 220 are formed by implanting a dopant of Boron at a concentration of about $1 \times 10^{15}/cm^3$; and the first well region 204 is formed by implanting a dopant of Phosphorous at a concentration of about $1 \times 10^{13}/cm^3$. As mentioned above, it will be appreciated that while implant doses and energies may be adjusted, they are nevertheless maintained such that the junction depth of the source drain regions 220 is less than that of the second 206 and third 208 well regions which is in turn less than that of the first well region 204 (to support required voltages). Also, dopant types may be adjusted (e.g., reversed) depending on the type of device(s) being fabricated.

Figure 10:
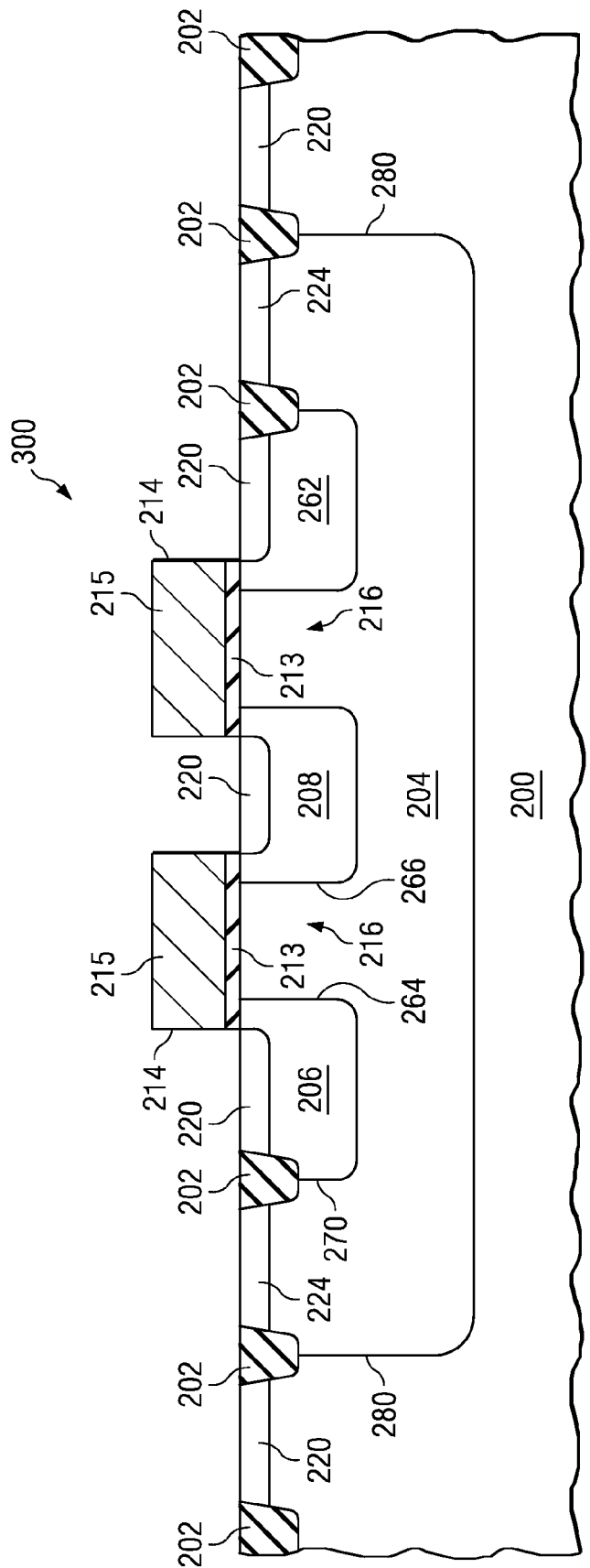

It will be appreciated that more than just one gate structure 214 and corresponding source/drain regions can be established without having to add to the method 100 illustrated in FIG. 1 (or use an additional mask). For example, a dual sided arrangement 300 that can be formed in a similar manner by patterning for more source/drain regions, well regions and gate structures is illustrated in FIG. 10. In the illustrated example, there is a fourth well region 262 having the first electrical conductivity type in the first well region 204, for example. Regardless of the arrangement, it can be seen (in FIGS. 9 and 10) that a first face 264 of the second well region 206 faces a first face 266 of the third well region 208 across the channel region 216, at least some of an isolation region 202 is located over a second face 270 of the second well region 206 opposite the first face 264 of the second well region 206 or at least some of an isolation region 202 is located over a second face 272 of the third well region 208 opposite the first face 266 of the third well region 208, the gate structure 214 resides over the first face 264 of the second well region 206 and the first face 266 of the third well region 208, and at least some of an isolation region 202 is located over an interface 280 between the first well region 204 and the substrate 200.

A transistor fashioned as described herein can be referred to as a "lateral" bipolar transistor due the lateral arrangement between the second well region 206 (having the first conductivity type), the channel region 216 of the first well region 204 (having the second conductivity type) and the third well region 208 (having the first conductivity type). The (increased) depths of the second 206 and third 208 well regions (relative to the source/drain regions 220 and/or the channel region 216) correspond to a larger cross sectional emitter/collector area (per total device area), which promotes an increased current density (which is desirable). That is, the amount of current that can be conducted (e.g., in the channel region 216) is increased without increasing the size of the device. This also improves (e.g., increases) the current gain of the resulting device, or the ratio of the collector current to the base current.

As illustrated herein, the second 206 and third 208 well regions (as well as any other additional well regions, such as fourth well region 262) are formed concurrently. That is, because a single (existing) mask is used in patterning an associated (lithographic) resist (209 in FIG. 4), and because the same implantation or implantations (207 in FIG. 4) are used to establish the well regions 206, 208, 262, etc., there is little to no variation among these regions (e.g., between the respective depths 230, 232 of the second 206 and third 208 well regions and/or between the respective widths 242, 244 of the second 206 and third 208 well regions). For example, any mask misalignment will affect the wells the same (e.g., they will all be similarly shifted). Because these regions play such an important role in the operation of the device, this lack of variation promotes uniform and consistent performance in the operation of the device, as well as among multiple devices produced across a wafer or die.

It will be appreciated that the substrate may comprise any type of semiconductor body (e.g., silicon, SiGe, SOI) such as a semiconductor wafer and/or one or more dies on a wafer, as well as any other type of semiconductor and/or epitaxial layers associated therewith. Also, while reference is made throughout this document to exemplary structures in discussing aspects of methodologies described herein (e.g., those structures presented in FIGS. 2-10 while discussing the methodology set forth in FIG. 1), those methodologies are not to be limited by the corresponding structures presented. Rather, the methodologies (and structures) are to be considered independent of one another and able to stand alone and be practiced without regard to any of the particular aspects depicted in the drawings. Additionally, unless indicated to the contrary, layers described herein, can be formed in any suitable manner, such as with spin-on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated.

What is claimed is:

1. An integrated circuit comprising a lateral bipolar transistor, comprising:
   isolation regions respectively isolating first, second, third, fourth and fifth surface portions of a first conductivity type region of a semiconductor substrate;
   a first well region of a second conductivity type formed in the second, third and fourth surface portions;
   second and third well regions of the first conductivity type formed in the first well region in the third surface portion; the second and third well regions being separated from each other across a channel region of the second conductivity type in the first well region in the third surface portion;
   a single gate structure including a gate electrode over a gate dielectric formed over the channel region, wherein at least part of the second and third well regions directly underlie the gate electrode;
   first source/drain regions comprising surface regions of a higher concentration of the first conductivity type formed within upper parts of the first and fifth surface portions and within upper parts of the second and third well regions; and
   second source/drain regions comprising surface regions of a higher concentration of the second conductivity type formed within upper parts of the second and fourth surface portions within the first well region;
   wherein the regions of the higher concentrations establish base, collector, emitter and substrate contact areas for the bipolar transistor.

2. The circuit of claim 1, wherein the surface regions of the higher concentration within the upper parts of the second and third well regions are formed with respective depths of the first source/drain regions between about ¼ and about 1/50$^{th}$ respective depths of the second and third well regions.

3. The circuit of claim 2, wherein the respective depths of the second and third well regions are between about one-half and about 1/20$^{th}$ of the depth of the first well region.

4. The circuit of claim 3, wherein the channel region has a length that is less than respective widths of the second and third well regions.

5. The circuit of claim 4, wherein the respective depths of the second and third well regions are less than the respective widths of the second and third well regions.

6. The circuit of claim 5, wherein respective widths of the surface regions of higher concentration within the upper parts of the second and third well regions are less than respective widths of the second and third well regions.

7. The circuit of claim 6, wherein the second and third well region are formed to a depth of between about 400 nm and about 700 nm.

8. The circuit of claim 7, wherein the surface regions of higher concentration within the upper parts of the second and third well regions are formed to a depth of between about 100 nm and about 200 nm.

9. The circuit of claim 8, wherein the second and third well regions are formed with an implanted dopant concentration of Boron of about $1\times10^{13}/cm^3$.

10. The circuit of claim 9, wherein the first well region is formed with an implanted dopant concentration of Phosphorous of about $1\times10^{13}/cm^3$.

11. The circuit of claim 10, wherein at least some part of the isolation regions are located over an interface between the first well region and the substrate.

12. An integrated circuit including a lateral bipolar transistor, comprising:
   isolation regions respectively isolating first, second, third, fourth and fifth surface portions of a first conductivity type region of a semiconductor substrate;
   a first well region of a second conductivity type formed in the second, third and fourth surface portions;
   second, third and fourth well regions of the first conductivity type fomied in the first well region in the third surface portion; the second, third and fourth well regions being separated from each other across respective first and second channel regions of the second conductivity type in the first well region in the third surface portion;
   first and second gate structures, each including a gate electrode over a gate dielectric, respectively formed over the first and second channel regions, wherein at least part of the second and third well regions directly underlie the gate electrode of the first gate structure;
   first source/drain regions comprising surface regions of a higher concentration of the first conductivity type formed within upper parts of the first and fifth surface portions and within upper parts of the second, third and fourth well regions; and
   second source/drain regions comprising surface regions of a higher concentration of the second conductivity type formed within upper parts of the second and fourth surface portions within the first well region;
   wherein the regions of the higher concentrations establish base, collector, emitter and substrate contact areas for the bipolar transistor.

13. An integrated circuit including a lateral bipolar transistor formed using CMOS transistor processing steps, comprising:
   isolation regions formed to respectively isolate first, second, third, fourth and fifth surface portions of a first conductivity type region of a semiconductor substrate;
   a first well region of a second conductivity type formed by dopant implanted into the second, third and fourth surface portions;
   second and third well regions of the first conductivity type formed in the first well region by dopant implanted into the third surface portion; the second and third well regions being separated from each other across a channel region in the third surface portion;
   a gate structure including a gate electrode over a gate dielectric formed over the channel region, wherein at least part of the second and third well regions directly underlie the gate electrode;
   first source/drain regions of implanted dopant within upper parts of the first and fifth surface portions and within upper parts of the second and third well regions establishing surface regions of a higher concentration of the first conductivity type; and
   second source/drain regions of implanted dopant within upper parts of the second and fourth surface portions establishing surface regions of a higher concentration of second conductivity type;
   wherein the regions of the higher concentrations establish base, collector, emitter and substrate contact areas for the bipolar transistor.

* * * * *